United States Patent
Phillips

(12)
(10) Patent No.: US 6,601,079 B1
(45) Date of Patent: Jul. 29, 2003

(54) CONVERTING BETWEEN DIFFERENT FLOATING POINT EXPONENT REPRESENTATIONS

(75) Inventor: John W. Phillips, Menlo Park, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 08/998,617

(22) Filed: Dec. 29, 1997

(51) Int. Cl.$^7$ ................................................. G06F 7/38
(52) U.S. Cl. ................................................. 708/495
(58) Field of Search ........................... 708/204–205, 708/495–514

(56) References Cited

U.S. PATENT DOCUMENTS 5,523,961 A * 6/1996 Naini ........................ 708/513
5,761,105 A * 6/1998 Goddard et al. ............ 708/510
5,768,169 A * 6/1998 Sharangpani ............... 708/495

* cited by examiner

*Primary Examiner*—Tan V. Mai
(74) *Attorney, Agent, or Firm*—Blakely, Sokoloff, Taylor & Zafman LLP

(57) ABSTRACT

A method for distinguishing an ordinary binary floating point number from an extraordinary binary floating point number is provided, the method including adding 1 to a B-bit biased exponent of a binary floating point number to produce a (B+1)-bit augmented exponent and sign-extending the augmented exponent to produce a (B+n)-bit transformed exponent. The method also includes testing the (B+n)-bit transformed exponent to determine if the (B+n)-bit transformed exponent is less than 2.

45 Claims, 4 Drawing Sheets

IEEE FORMATS FOR FLOATING POINT NUMBERS

SINGLE PRECISION REAL

DOUBLE PRECISION REAL

EXTENDED PRECISION REAL

INTERNAL REPRESENTATION

S - SIGN
E - BIASED EXPONENT
F - FRACTION
J - JBIT IMAGINARY 1 OF 1. FRACTION
I - SIGN OF INTEGER
GRS - GUARD, ROUND, AND STICKY BITS

CONVERTING BETWEEN DIFFERENT FLOATING POINT EXPONENT REPRESENTATIONS

BACKGROUND OF THE INVENTION

1. Field of the Invention

This invention relates generally to the field of semiconductor microprocessors, and, more particularly, to the way that "ordinary" floating point data representations are distinguished from "extraordinary" floating point data representations.

2. Description of the Related Art

Floating point data can typically have different representations. Commonly, a user conforming, for example, to the standard Institute of Electrical and Electronic Engineers (IEEE) formats will provide data to a microprocessor in single precision real, double precision real or extended precision real formats. Because of the difficulty in performing mixed format arithmetic operations (e.g., multiplication of a single precision real number by a double precision real number), many microprocessors convert floating point data to a predetermined standard format before beginning any operation. All the arithmetic operations are then performed, using the data converted to the predetermined standard format. After all arithmetic operations have been completed, the result is usually converted back to any desired user format.

A floating point number A includes a significand (or mantissa or fraction) $S_a$ and an exponent $E_a$. The value of the floating point number A is given by the equation $A=S_a r^{E_a}$ where r is the radix (or base) of the number system. The significand is usually normalized by requiring that the most significant digit (or the leftmost digit) be nonzero. Use of the binary radix (i.e., r=2) gives maximum accuracy, but may require more frequent normalization than use of higher radices.

Floating point numbers are capable of representing a wide range of values, from very large values to very small values, while maintaining the same precision throughout. Although a variety of data types are possible, floating point numbers usually assume one of the standard IEEE formats shown in FIG. 1. For example, FIG. 1 shows a 32-bit single precision real binary number, according to the IEEE 754 Standard (*IEEE Standard for Floating-Point Arithmetic*, IEEE Std 754-1985, reaffirmed 1990), having a sign S bit 10, a biased exponent E(8) portion 11, having 8 bits, and a significand F(23) (or mantissa or fraction) portion 12, having 23 bits. The normalized value of such a 32-bit single precision real binary number, according to the IEEE 754 Standard, is given by the equation $A_{32sp}=(-1)^S 1.F(23)2^{E(8)-127}$ where the "binary point" (similar to the decimal point in base-10) is immediately to the right of the most significant bit. Similarly, FIG. 1 shows a 64-bit double precision real binary number, according to the IEEE 754 Standard, having a sign S bit 13, a biased exponent E(11) portion 14, having 11 bits, and a significand F(52) (or mantissa or fraction) portion 15, having 52 bits. The normalized value of such a 64-bit double precision real binary number, according to the IEEE 754 Standard, is given by the equation $A_{64dp}=(-1)^S 1.F(52)2^{E(11)-1023}$ where the binary point is again immediately to the right of the most significant bit.

FIG. 1 shows an 80-bit extended double precision real binary number, according to the IEEE 754 Standard, having a sign S bit 19, a biased exponent E(15) portion 17, having 15 bits, and a remaining portion, having 64 bits, including a significand F(63) (or mantissa or fraction) portion 18, having 63 bits and a single J-bit). The normalized value of such an 80-bit extended precision real binary number, according to the IEEE 754 Standard, is given by the equation $A_{80ep}=(-1)^S(i)^J 1.F(63)2^{E(15)-16383}$ where i is the square root of (-1) and the binary point is still immediately to the right of the most significant bit.

FIG. 1 also shows an exemplary 86-bit internal binary representation useful in a microprocessor, having a sign S bit, a biased exponent E(17) portion 20, having 17 bits, and a remaining portion, having 68 bits, including a significand F(63) (or mantissa or fraction) portion 21, having 63 bits, a single I-bit, a single J-bit, a single Guard bit, a single Round bit and a single Sticky bit. By using such an internal representation that is larger than any of the IEEE Standard formats that a microprocessor can accommodate, overflow and rounding errors that normally occur during arithmetic operations may be virtually eliminated, for example.

The B-bit biased exponent $E_{bias}(B)$ ranges from 0 to $2^B-1$ in the IEEE Standard format binary floating point representations because the relative sizes of the biased exponents $E_{bias}(B)$ of different floating point numbers are then simpler to determine. The effective value of the exponent of the binary radix (r=2) is determined by subtracting a bias value $2^{(B-1)}-1$ from the B-bit biased exponent value $E_{bias}(B)$. The range of effective values of the exponent of the binary radix (r=2) is from $-(2^{(B-1)}-1)$ to $2^{(B-1)}$, corresponding to the B-bit biased exponent $E_{bias}(B)$ range of from 0 to $2^B-1$, respectively.

The IEEE Standard format binary floating point representations having B-bit biased exponents $E_{bias}(B)$ ranging from 1 to $2^B-2$ are "ordinary" or "nonexceptional" binary floating point representations. The IEEE Standard format binary floating point representations having B-bit biased exponents $E_{bias}(B)$ of 0 or $2^B-1$ are "extraordinary" or "exceptional" binary floating point representations. A B-bit biased exponent value $E_{bias}(B)=0$ in the IEEE Standard format binary floating point representations serves as a flag or token for the number 0 (if the significand value is also 0) and for denormalized or subnormalized numbers (if the significand value is not also 0). A B-bit biased exponent value $E_{bias}(B)=2^B-1$ in the IEEE Standard format binary floating point representations serves as a flag or token for infinity (if the significand value is 0) and for "Not a Number" (NaN) indicators (if the significand value is not 0).

The conversion between different floating point representation formats is a low-level, performance-critical operation. As such, the conversion between different floating point representation formats is typically performed by various floating point hardware circuits. In some cases, however, the floating point hardware circuits cannot perform the conversion between different floating point representation formats because of the coincidence of the conversion with other system events, such as a cache line split on a memory operand, for example. In these cases, a floating point software handler performs the conversion between different floating point representation formats. Doing this conversion involves two relatively independent operations: (1) rounding the significand, and (2) converting the exponent.

As described above, the exponent field is made up of B bits, giving $2^B$ possible binary exponent representations that each belong to one of two classes of representations: "ordinary" binary floating point representations, corresponding to an actual exponent for a binary-encoded floating point number, and "extraordinary" binary floating point representations, corresponding to entities such as zero, infinity and "Not a Number" (NaN) that are not otherwise readily encoded by binary floating point representations. When converting a floating point quantity between two different representations, the function to be applied to the exponent field depends on the respective class of the binary floating point representation. It would be desirable to distinguish, and to make distinctions between, the two classes of binary floating point representations, to discriminate quickly and reliably between the "ordinary" and the "extraordinary" binary floating point representations and to detect, and to filter out, the "extraordinary" binary floating point representations, as needed.

The cases where the floating point hardware circuits cannot perform the conversion between different floating point representation formats are implementation-dependent and may not be self-evident. The cases where the floating point hardware circuits cannot perform the conversion between different floating point representation formats may also be frequent enough that having an inadequate floating point software assist can affect the over-all performance of the whole system.

The present invention is directed to overcoming, or at least reducing the effects of, one or more of the problems set forth above.

SUMMARY OF INVENTION

In one aspect of the present invention, a method for distinguishing an ordinary binary floating point number from an extraordinary binary floating point number is provided, the method including adding 1 to a B-bit biased exponent of a binary floating point number to produce a (B+1)-bit augmented exponent and sign-extending the (B+1)-bit augmented exponent to produce a (B+n)-bit transformed exponent. The method also includes testing the (B+n)-bit transformed exponent to determine if the (B+n)-bit transformed exponent is less than 2.

BRIEF DESCRIPTION OF THE DRAWINGS

Other objects and advantages of the invention will become apparent upon reading the following detailed description and upon reference to the drawings in which.

Figure 1:
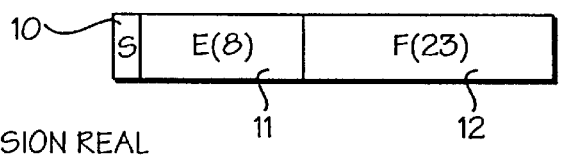
FIG. 1 illustrates standard IEEE formats for binary floating point numbers having single, double and extended precision real formats and shows an exemplary internal representation for a processor.
Figure 1:
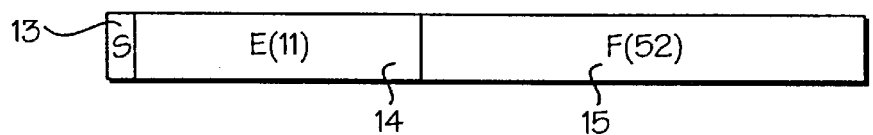
Figure 1:
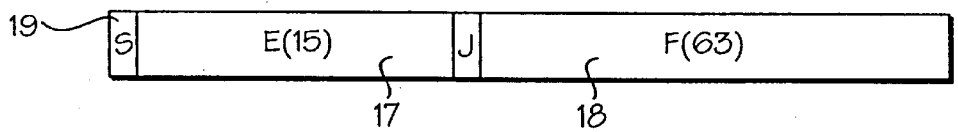
Figure 1:
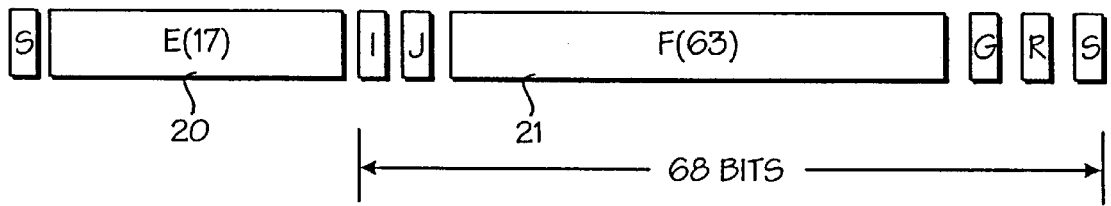

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, that will vary from one implementation to another. Moreover, it will be appreciated that such a development effort might be complex and time-consuming, but would nevertheless be a routine undertaking for those of ordinary skill in the art having the benefit of this disclosure.

Figure 2:
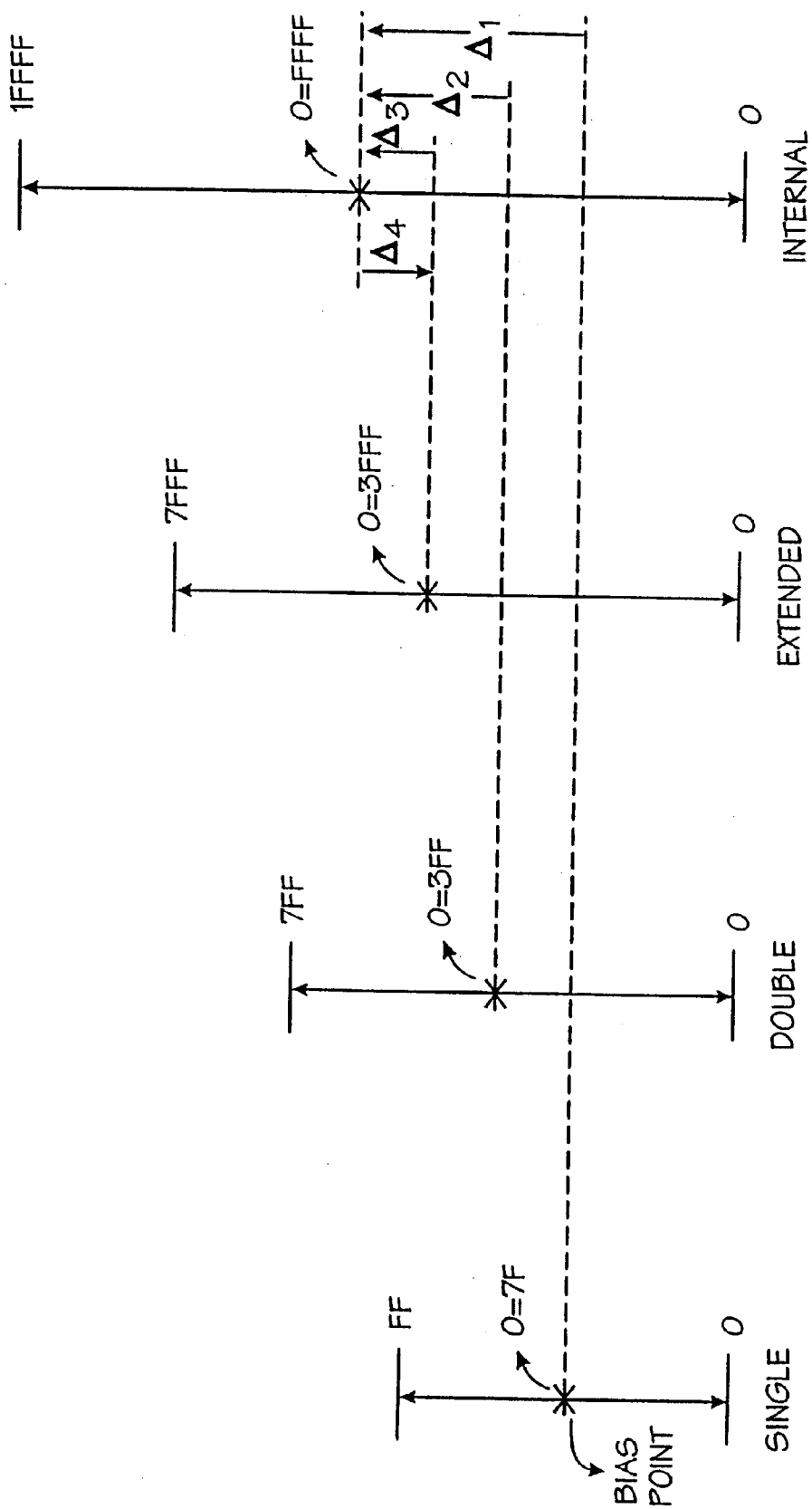
FIG. 2 illustrates the range and bias points for the floating point data formats of FIG. 1 and shows the shift in bias level required for a conversion from one format to another.

Turning now to the drawings, and in particular to FIG. 2, the range and bias points of single, double, extended and internal binary floating point representations are shown. According to FIG. 2, a single precision real number may have an 8-bit (binary) biased exponent value ranging anywhere between 00000000 (hexadecimal 00) and 11111111 (hexadecimal FF). The bias point for each format is located mid-way between the maximum and minimum values. For example, in the single precision real representation, the bias point is the 8-bit binary number 01111111 (hexadecimal 7F). A double precision real number may have an 11-bit (binary) biased exponent value ranging anywhere between (0)00000000000 (the parenthetical 12th bit merely facilitates a correspondence with hexadecimal 000) and (0)11111111111 (hexadecimal 7FF) and the bias point is the 11-bit binary number (0)01111111111 (hexadecimal 3FF). An extended double precision real number may have a 15-bit (binary) biased exponent value ranging anywhere between (0)000000000000000 (hexadecimal 0000) and (0)111111111111111 (hexadecimal 7FFF) and the bias point is the 15-bit binary number (0)011111111111111 (hexadecimal 3FFF). An internal representation real number may have a 17-bit (binary) biased exponent value ranging anywhere between (000)00000000000000000 (hexadecimal 00000) and (000)11111111111111111 (hexadecimal 1FFFF) and the bias point is the 17-bit binary number (000) 01111111111111111 (hexadecimal 0FFFF).

To convert from the exponent E(8) of the single precision real representation to the exponent E(17) of the internal representation, for example, the bias (hexadecimal 7F) for E(8) may be subtracted from E(8) and then the bias (hexadecimal FFFF) for E(17) may be added, or, equivalently, the shift $\Delta_1$=FFFF-7F=FF80 (hexadecimal) may be added to E(8). Similarly, to convert from the exponent E(11) of the double precision real representation to the exponent E(17) of the internal representation, for example, the bias (hexadecimal 3FF) for E(11) may be subtracted from E(11) and then the bias (hexadecimal FFFF) for E(17) may be added, or, equivalently, the shift $\Delta_2$=FFFF-3FF=FC00 (hexadecimal) may be added to E(11). Likewise, to convert from the exponent E(15) of the extended precision real representation to the exponent E(17) of the internal representation, for example, the bias (hexadecimal 3FFF) for E(15) may be subtracted from E(15) and then the bias (hexadecimal FFFF) for E(17) may be added, or, equivalently, the shift $\Delta_3$=FFFF-3FFF=C000 (hexadecimal) may be added to E(15). Conversely, to convert from the exponent E(17) of the internal representation exponent E(17) to the exponent E(15) of the extended precision real representation, for example, the bias (hexadecimal FFFF) for E(17) may be subtracted from E(17) and then the bias (hexadecimal 3FFF) for E(15) may be added, or, equivalently, the shift $\Delta_4$=3FFF-FFFF=-C000 (hexadecimal) may be added to E(17).

The endpoints of the respective ranges of the exponent values may correspond to the "extraordinary" floating point representations and all points in between the endpoints may correspond to the "ordinary" floating point representations. For the single, double, extended and internal binary floating point representations as shown in FIG. 2, the "extraordinary" floating point representations have binary exponents that are either all 0's or all 1's. As described above, the conversion between different floating point representation formats is a low-level, performance-critical operation. As such, the conversion between different floating point representation formats is typically performed by various floating point hardware circuits. In some cases, however, the floating point hardware circuits cannot perform the conversion between different floating point representation formats because of the coincidence of the conversion with other system events, such as a cache line split on a memory operand, for example. In these cases, a floating point software handler performs the conversion between different floating point representation formats. The floating point software handler, however, may have difficulty distinguishing the "extraordinary" floating point representations having binary exponents that are either all 0's or all 1's from the "ordinary" floating point representations having binary exponents that are not either all 0's or all 1's.

Figure 3:
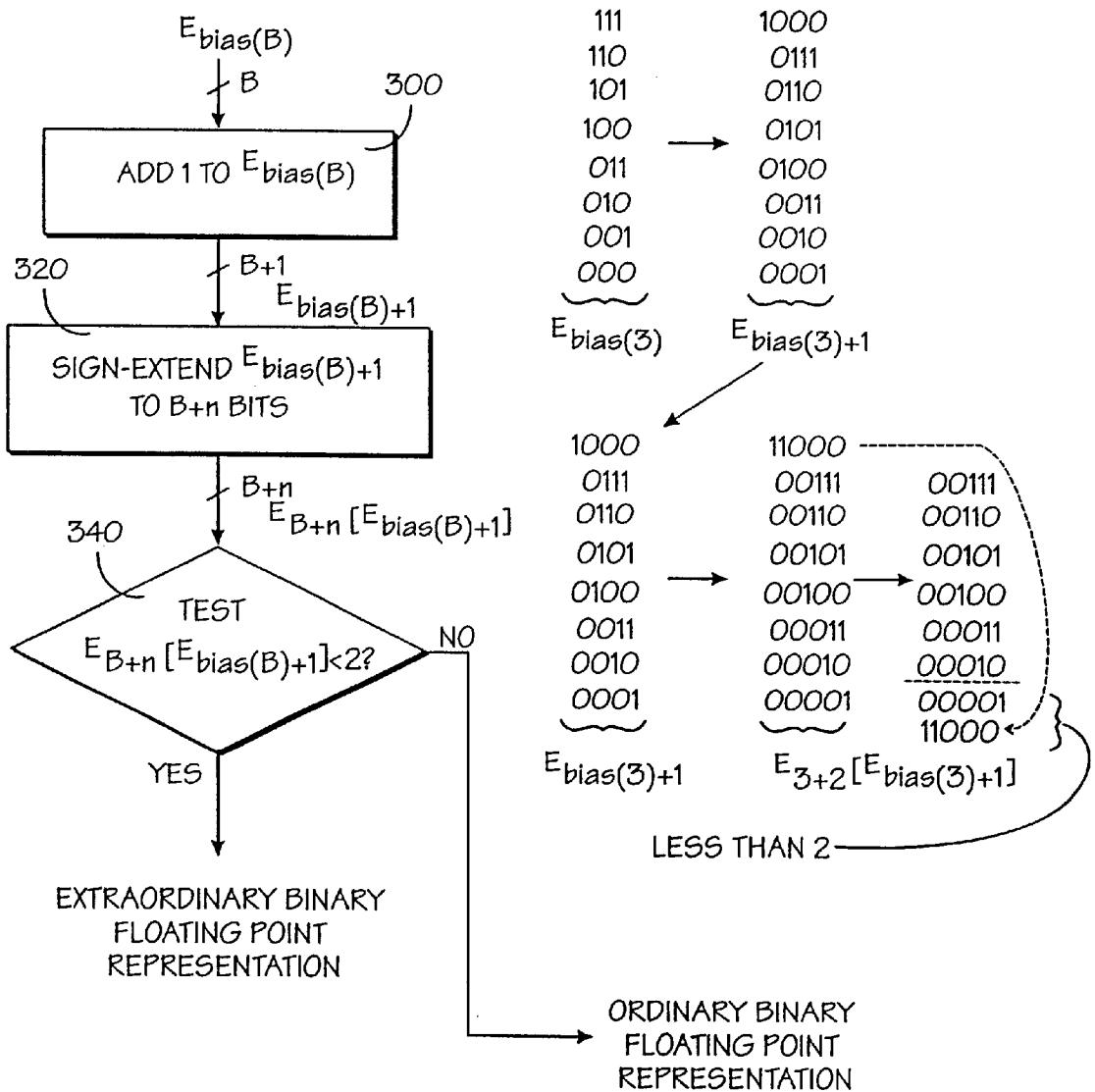
FIG. 3 shows an exemplary embodiment of the present invention.

Turning now to FIG. 3, an exemplary embodiment of a method for distinguishing an ordinary binary floating point number from an extraordinary binary floating point number is described. As shown at 300 in FIG. 3, 1 is added to the B-bit biased exponent $E_{bias}(B)$ of the N-bit binary floating point number $A(N)=S_a(N-B)2^{E_{bias}(B)-(2^{B-1}-1)}$ (where the significand $S_a(N-B)$ has N−B bits) to produce the (B+1)-bit augmented exponent $E_{bias}(B)+1$. Then, as shown at 320 in FIG. 3, the (B+1)-bit augmented exponent $E_{bias}(B)+1$ is sign-extended to produce a (B+n)-bit transformed exponent $E_{B+n}[E_{bias}(B)+1]$. Sign-extending an M-bit binary number to produce an (N+r)-bit binary number may involve replicating the most significant (leftmost) bit of the M-bit binary number r times so that the (r+1) most significant bits of the (M+r)-bit sign-extended binary number are all identical. For example, for M=4 and r=2, sign-extending the 4-bit binary number 1010 to produce a 6-bit sign-extended binary number may produce 111010, where the 3 most significant bits are all 1's. Similarly, for M=3 and r=3, sign-extending the 3-bit binary number 011 to produce a 6-bit sign-extended binary number may produce 000011, where the 4 most significant bits are all 0's.

As shown at 340 in FIG. 3, the (B+n)-bit transformed exponent $E_{B+n}[E_{bias}(B)+1]$ is then tested to determine if the (B+n)-bit transformed exponent $E_{B+n}[E_{bias}(B)+1]$ is less than 2. A (B+n)-bit signed-compare may be used for testing to determine if the (B+n)-bit transformed exponent $E_{B+n}[E_{bias}(B)+1]$ is less than 2. The (B+n)-bit signed-compare assumes that the binary number to be tested is in a two's complement binary number representation. The most significant bit in a two's complement binary number representation indicates the sign of the number, "0" indicating a non-negative number, and "1" indicating a negative number (a number less than 0). The negative of a number in the two's complement binary number representation is obtained by complementing all of the bits of the number in the two's complement binary number representation (changing every "0" to a "1" and every "1" to a "0") and then adding 1 to the least significant bit of the complemented number. For example, negating 010110 gives −(010110)=(101001+000001)=101010, and, consistently, negating 101010 gives −(101010)=(010101+000001)=010110.

If the (B+n)-bit transformed exponent $E_{B+n}[E_{bias}(B)+1]$ is less than 2, then the B-bit biased exponent $E_{bias}(B)$ of the N-bit binary floating point number $A(N)=S_a(N-B)2^{E_{bias}(B)-(2^{B-1}-1)}$ is either all 0's or all 1's and the N-bit binary floating point number A(N) is an extraordinary binary floating point representation. If the B-bit biased exponent $E_{bias}(B)$ is all 0's, the B-bit binary number representing 0, then adding 1 to 0 produces a (B+1)-bit augmented exponent $E_{bias}(B)+1$ that is equal to a (B+1)-bit binary number representing 1, having B 0's as the most significant bits and having a 1 as the least significant (rightmost) bit. Sign-extending the (B+1)-bit binary number representing 1 produces a (B+n)-bit binary number representing 1, having (B+n−1) 0's as the most significant bits and having a 1 as the least significant bit, and 1 is certainly less than 2.

Similarly, if the B-bit biased exponent $E_{bias}(B)$ is all 1's, the B-bit binary number representing $2^B-1$, then adding 1 to $2^B-1$ produces a (B+1)-bit augmented exponent $E_{bias}(B)+1$ that is equal to a (B+1)-bit binary number representing $2^B$, having a 1 as the most significant bit and having B 0's as the least significant bits. Sign-extending the (B+1)-bit binary number representing $2^B$ produces a (B+n)-bit binary number having n 1's as the most significant bits and having B 0's as the least significant bits. The (B+n)-bit binary number having n 1's as the most significant bits and having B 0's as the least significant bits is interpreted by the (B+n)-bit signed-compare as a two's complement binary number representing $-(2^B)$, and $-(2^B)$ is also certainly less than 2.

On the other hand, if the (B+n)-bit transformed exponent $E_{B+n}[E_{bias}(B)+1]$ is not less than 2, then the B-bit biased exponent $E_{bias}(B)$ of the N-bit binary floating point number $A(N)=S_a(N-B)2^{E_{bias}(B)-(2B-1-1)}$ is neither all 0's nor all 1's and the N-bit binary floating point number A(N) is an ordinary binary floating point representation. For example, if the B-bit biased exponent $E_{bias}(B)$ is the B-bit binary number representing 1, having (B−1) 0's as the most significant bits and having a 1 as the least significant bit, then adding 1 to 1 produces a (B+1)-bit augmented exponent $E_{bias}(B)+1$ that is equal to a (B+1)-bit binary number representing 2, having (B−1) 0's as the most significant bits and having 10 as the two least significant bits. Sign-extending the (B+1)-bit binary number representing 2 produces a (B+n)-bit binary number representing 2, having (B+n−2) 0's as the most significant bits and having 10 as the two least significant bits, and 2 is certainly not less than 2.

Similarly, if the B-bit biased exponent $E_{bias}(B)$ is the B-bit binary number representing $2^B-2$, having (B−1) 1's as the most significant bits and having a 0 as the least significant bit, then adding 1 to $2^B-2$ produces a (B+1)-bit augmented exponent $E_{bias}(B)+1$ that is equal to a (B+1)-bit binary number representing $2^B-1$, having a 0 as the most significant bit and having B 1's as the least significant bits. Sign-extending the (B+1)-bit binary number representing $2^B-1$ produces a (B+n)-bit binary number having n 0's and B 1's, representing $2^B-1$ again, and $2^B-1$ is also certainly not less than 2, as long as B is greater than 1.

As shown in FIG. 3, when B=3 and n=2, for example, adding 1 to the 3-bit biased exponents $E_{bias}(3)$: 000, 001, 010, 011, 100, 101, 110 and 111 produces the 4-bit augmented exponents $E_{bias}(3)+1$: 0001, 0010, 0011, 0100, 0101, 010, 0111 and 1000. Sign-extending the 4-bit augmented exponents $E_{bias}(3)+1$ produces the 5-bit transformed exponents $E_{3+2}[E_{bias}(3)+1]$: 00001, 00010, 00011, 00100, 00101, 00110, 00111 and 11000. Testing the 5-bit transformed exponents $E_{3+2}[E_{bias}(3)+1]$ to determine if the 5-bit transformed exponents $E_{3+2}[E_{bias}(3)+1]$ are less than 2 distinguishes the ordinary binary floating point representations: 00010, 00011, 00100, 00101, 00110 and 00111, that are not less than 2, from the extraordinary binary floating point representations: 00001 and 11000 (interpreted by the 5-bit signed-compare as the two's complement binary number representation of −8), that are less than 2.

Figure 4:
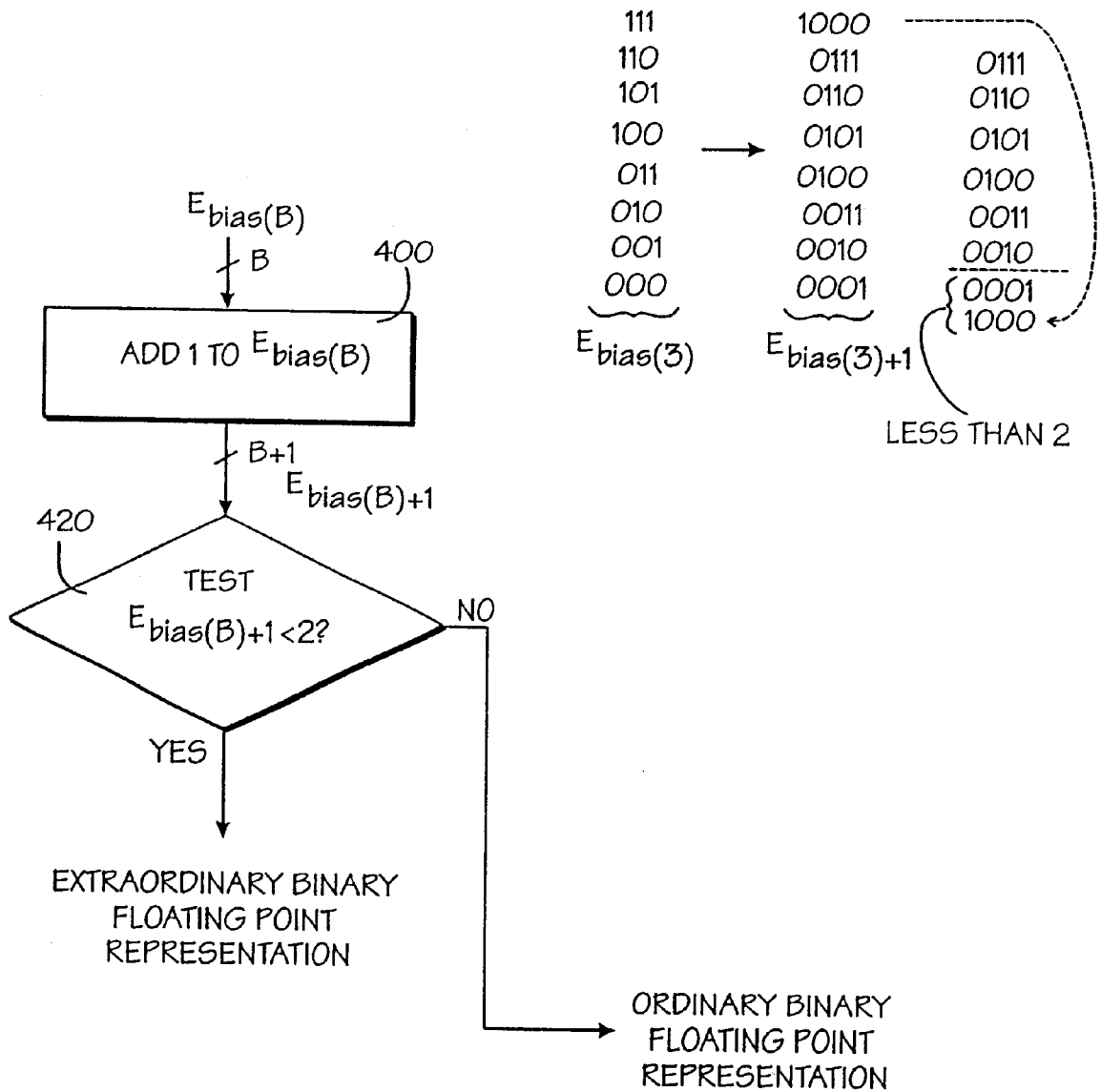
FIG. 4 shows another exemplary embodiment of the present invention.

Turning now to FIG. 4, another exemplary embodiment of a method for distinguishing an ordinary binary floating point number from an extraordinary binary floating point number is described. As shown at 400 in FIG. 4, 1 is added to the B-bit biased exponent $E_{bias}(B)$ of the N-bit binary floating point number $A(N)=S_a(N-B)2^{E_{bias}(B)-(2^{B-1}-1)}$ (where the significand $S_a(N-B)$ has N−B bits) to produce the (B+1)-bit augmented exponent $E_{bias}(B)+1$. Then, as shown at 420 in FIG. 4, the (B+1)-bit augmented exponent $E_{bias}(B)+1$ is tested by a (B+1)-bit signed-compare to determine if the (B+1)-bit augmented exponent $E_{bias}(B)+1$ is less than 2. A (B+1)-bit signed-compare may be used for testing to determine if the (B+1)-bit augmented exponent $E_{bias}(B)+1$ is less than 2. The (B+1)-bit signed-compare assumes that the binary number to be tested is in a two's complement binary number representation.

If the (B+1)-bit augmented exponent $E_{bias}(B)+1$ is less than 2, then the B-bit biased exponent $E_{bias}(B)$ of the N-bit binary floating point number $A(N)=S_a(N-B)2^{E_{bias}(B)-(2^{B-1}-1)}$ is either all 0's or all 1's and the N-bit binary floating point number A(N) is an extraordinary binary floating point representation. If the B-bit biased exponent $E_{bias}(B)$ is all 0's, the B-bit binary number representing 0, then adding 1 to 0 produces a (B+1)-bit augmented exponent $E_{bias}(B)+1$ that is equal to a (B+1)-bit binary number representing 1, having B 0's as the most significant bits and having a 1 as the least significant (rightmost) bit, and 1 is certainly less than 2.

Similarly, if the B-bit biased exponent $E_{bias}(B)$ is all 1's, the B-bit binary number representing $2^B-1$, then adding 1 to $2^B-1$ produces a (B+1)-bit augmented exponent $E_{bias}(B)+1$ that is equal to a (B+1)-bit binary number representing $2^B$, having a 1 as the most significant bit and having B 0's as the least significant bits. The (B+1)-bit binary number representing $2^B$, having a 1 as the most significant bit and having B 0's as the least significant bits, is interpreted by the (B+1)-bit signed-compare as a two's complement binary number representing $-(2^B)$, and $-(2^B)$ is also certainly less than 2.

On the other hand, if the (B+1)-bit augmented exponent $E_{bias}(B)+1$ is not less than 2, then the B-bit biased exponent $E_{bias}(B)$ of the N-bit binary floating point number $A(N)=S_a(N-B)2^{E_{bias}(B)-(2^{B-1}-1)}$ is neither all 0's nor all 1's and the N-bit binary floating point number A(N) is an ordinary binary floating point representation. For example, if the B-bit biased exponent $E_{bias}(B)$ is the B-bit binary number representing 1, having (B−1) 0's as the most significant bits and having a 1 as the least significant bit, then adding 1 to 1 produces a (B+1)-bit augmented exponent $E_{bias}(B)+1$ that is equal to a (B+1)-bit binary number representing 2, having (B−1) 0's as the most significant bits and having 10 as the two least significant bits, and 2 is certainly not less than 2.

Similarly, if the B-bit biased exponent $E_{bias}(B)$ is the B-bit binary number representing $2^B-2$, having (B−1) 1's as the most significant bits and having a 0 as the least significant bit, then adding 1 to $2^B-2$ produces a (B+1)-bit augmented exponent $E_{bias}(B)+1$ that is equal to a (B+1)-bit binary number representing $2^B-1$, having a 0 as the most significant bit and having B 1's as the least significant bits, and $2^B-1$ is also certainly not less than 2, as long as B is greater than 1.

As shown in FIG. 4, when B=3, for example, adding 1 to the 3-bit biased exponents $E_{bias}(3)$: 000, 001, 010, 011, 100, 101, 110 and 111 produces the 4-bit augmented exponents $E_{bias}(3)+1$: 0001, 0010, 0011, 0100, 0101, 0110, 0111 and 1000. Testing the 4-bit augmented exponents $E_{bias}(3)+1$ to determine if the 4-bit augmented exponents $E_{bias}(3)+1$ are less than 2 distinguishes the ordinary binary floating point representations: 0010, 0011, 0100, 0101, 0110 and 0111, that are not less than 2, from the extraordinary binary floating point representations: 0001 and 1000 (interpreted by the 4-bit signed-compare as the two's complement binary number representation of −8), that are less than 2.

The above-described embodiments are illustrative and should not be considered as limiting the scope of the present invention. For example, embodiments according to the present invention may be implemented in an expensive medium, such as in microcode. Such an implementation of embodiments of the present invention for distinguishing an ordinary binary floating point number from an extraordinary binary floating point number in microcode may advantageously occupy less code space than would conventional software for distinguishing an ordinary binary floating point number from an extraordinary binary floating point number.

What is claimed is:

1. A computerized method for distinguishing an ordinary binary floating point number from an extraordinary binary floating point number, said computerized method comprising:

adding 1 to a B-bit biased exponent of a binary floating point number to produce a (B+1)-bit augmented exponent;

sign-extending said (B+1)-bit augmented exponent to produce a (B+n)-bit transformed exponent; and testing said (B+n)-bit transformed exponent to determine if said (B+n)-bit transformed exponent is less than 2 to provide an indication whether the binary floating point number is ordinary or extraordinary.

2. The method of claim 1, wherein said testing includes interpreting said (B+n)-bit transformed exponent as a two's complement binary number representation by using a (B+n)-bit signed-compare.

3. The method of claim 2, wherein said interpreting includes interpreting the most significant bit of said (B+n)-bit transformed exponent as a sign of the number and applying the sign in interpreting said (B+n)-bit transformed exponent.

4. The method of claim 1, wherein n is at least equal to 1.

5. The method of claim 1, wherein n is at least equal to 2.

6. The method of claim 1, wherein n is at least equal to B.

7. The method of claim 1, wherein B is at least equal to 8.

8. The method of claim 1, wherein B is at least equal to 11.

9. The method of claim 1, wherein B is at least equal to 15.

10. The method of claim 1, wherein B is at least equal to 17.

11. The method of claim 1, wherein said sign-extending includes replicating the most significant bit of said augmented exponent r times so that the r+1 most significant bits of said augmented exponent are all identical.

12. A computerized method for distinguishing an ordinary binary floating point number from an extraordinary binary floating point number, said computerized method comprising:

adding 1 to a B-bit biased exponent of a binary floating point number to produce a (B+1)-bit augmented exponent; and testing said (B+1)-bit augmented exponent to determine if said (B+1)-bit augmented exponent is less than 2, interpreting said (B+1)-bit augmented exponent as a two's complement binary number representation by using a (B+1)-bit signed-compare to provide an indication whether the binary floating point number is ordinary or extraordinary.

13. An article of manufacture comprising:
a computer useable medium having a computer readable program code embodied in said medium for causing a computer to distinguish an ordinary binary floating point number from an extraordinary binary floating point number, said computer readable program code in said article of manufacture including:
computer readable program code for causing said computer to add 1 to a B-bit biased exponent of a binary floating point number to produce a (B+1)-bit augmented exponent;
computer readable program code for causing said computer to sign-extend said (B+1)-bit augmented exponent to produce a (B+n)-bit transformed exponent; and
computer readable program code for causing said computer to test said (B+n)-bit transformed exponent to determine if said (B+n)-bit transformed exponent is less than 2.

14. The article of manufacture of claim 13, wherein said testing includes interpreting said (B+n)-bit transformed exponent as a two's complement binary number representation by using a (B+n)-bit signed-compare.

15. The article of manufacture of claim 14, wherein said interpreting includes interpreting the most significant bit of said (B+n)-bit transformed exponents as a sign of the number and applying the sign in interpreting said (B+n)-bit transformed exponent.

16. The article of manufacture of claim 13, wherein n is at least equal to 1.

17. The article of manufacture of claim 13, wherein n is at least equal to 2.

18. The article of manufacture of claim 13, wherein n is at least equal to B.

19. The article of manufacture of claim 13, wherein B is at least equal to 8.

20. The article of manufacture of claim 13, wherein B is at least equal to 11.

21. The article of manufacture of claim 13, wherein B is at least equal to 15.

22. The article of manufacture of claim 13, wherein B is at least equal to 17.

23. The article of manufacture of claim 13, wherein said sign-extending includes replicating the most significant bit of said augmented exponent r times so that the r+1 most significant bits of maid augmented exponent are all identical.

24. An article of manufacture comprising:
a computer useable medium having a computer readable program code embodied in said medium for causing a computer to discriminate an ordinary binary floating point number from an extraordinary binary floating point number, said computer readable program code in said article of manufacture including:
computer readable program code for causing said computer to add 1 to a B-bit biased exponent of a binary floating point number to produce a (B+1)-bit augmented exponent; and
computer readable program code for causing said computer to test said (B+1)-bit augmented exponent to determine if said (B+1)-bit augmented exponent is less than 2, interpreting said (B+1)-bit augmented exponent as a two's complement binary number representation by using a (B+1)-bit signed-compare.

25. The article of manufacture of claim 24, further comprising computer readable program code for causing said computer to sign-extend said (B+1)-bit augmented exponent to produce a (B+n)-bit transformed exponent by replicating the most significant bit of said augmented exponent r times so that the r+1 most significant bits of said augmented exponent are all identical.

26. The article of manufacture of claim 24, wherein said testing includes interpreting said (B+n)-bit transformed exponent as a two's complement binary number representation by using a (B+n)-bit signed-compare.

27. A program storage device readable by a machine, tangibly embodying a program of instructions executable by the machine to perform a method for distinguishing an ordinary binary floating point number from an extraordinary binary floating point number, said method comprising:
adding 1 to a B-bit biased exponent of a binary floating point number to produce a (B+1)-bit augmented exponent;
sign-extending said (B+1)-bit augmented exponent to produce a (B+n)-bit transformed exponent; and
testing said (B+n)-bit transformed exponent to determine if said (B+n)-bit transformed exponent is less than 2.

28. The program storage device of claim 27, wherein said testing includes interpreting said (B+n)-bit transformed exponent as a two's complement binary number representation by using a (B+n)-bit signed-compare.

29. The article of manufacture of claim 28, wherein said interpreting includes interpreting the most significant bit of said (B+n)-bit transformed exponent as a sign of the number and applying the sign in interpreting said (B+n)-bit transformed exponent.

30. The program storage device of claim 27, wherein n is at least equal to 1.

31. The program storage device of claim 27, wherein n is at least equal to 2.

32. The program storage device of claim 27, wherein n is at least equal to B.

33. The program storage device of claim 27, wherein B is at least equal to 8.

34. The program storage device of claim 27, wherein B is at least equal to 11.

35. The program storage device of claim 27, wherein B is at least equal to 15.

36. The program storage device of claim 27, wherein B is at least equal to 17.

37. A program storage device readable by a machine, tangibly embodying a program of instructions executable by the machine to perform a method for distinguishing an ordinary binary floating point number from an extraordinary binary floating point number, said method comprising:
adding 1 to a B-bit biased exponent of a binary floating point number to produce a (B+1)-bit augmented exponent; and
testing said (B+1)-bit augmented exponent to determine if said (B+1)-bit augmented exponent is less than 2, interpreting said (B+1)-bit augmented exponent as a two's complement binary number representation by using a (B+1)-bit signed-compare.

38. The method of claim 37, further comprising sign-extending said (B+1)-bit augmented exponent to produce a (B+n)-bit transformed exponent.

39. The method of claim 38, wherein said sign-extending includes replicating the most significant bit of said augmented exponent r times so that the r+1 most significant bits of said augmented exponent are all identical.

40. The method of claim 37, wherein said testing includes interpreting said (B+n)-bit transformed exponent as a two's complement binary number representation by using a (B+n)-bit signed-compare.

41. The method of claim 40, wherein said interpreting includes interpreting the most significant bit of said (B+n)-bit transformed exponent as a sign of the number and applying the sign in interpreting said (B+n)-bit transformed exponent.

42. A floating point hardware conversion circuit for distinguishing an ordinary binary floating point number from an extraordinary binary floating point number, said circuit performing operations comprising:

adding 1 to a B-bit biased exponent of a binary floating point number to produce a(B+1)-bit augmented exponent;

sign-extending said (B+1)-bit augmented exponent to produce a (B+n)-bit transformed exponent; and testing said (B+n)-bit transformed exponent to determine if said (B+n)-bit transformed exponent is less than 2 to provide an indication whether the binary floating point number is ordinary or extraordinary.

43. The circuit of claim 42, wherein said sign-extending includes replicating the most significant bit of said augmented exponent r times so that the r+1 most significant bits of said augmented exponent are all identical.

44. The circuit of claim 42, wherein said testing includes interpreting said (B+n)-bit transformed exponent as a two's complement binary number representation by using a (B+n)-bit signed-compare.

45. The circuit of claim 44, wherein said interpreting includes interpreting the most significant bit of said (B+n)-bit transformed exponent as a sign of the number and applying the sign in interpreting said (B+n)-bit transformed exponent.

* * * * *

UNITED STATES PATENT AND TRADEMARK OFFICE
CERTIFICATE OF CORRECTION

PATENT NO. : 6,601,079 B1 Page 1 of 1
DATED : July 29, 2003
INVENTOR(S) : Phillips It is certified that error appears in the above-identified patent and that said Letters Patent is hereby corrected as shown below:

<u>Column 5,</u>
Line 34, delete the expression "N+r" and insert -- M+r --.

<u>Column 6,</u>
Line 56, delete "010" and insert -- 0110 --.

<u>Column 9,</u>
Line 47, delete "maid" and insert -- said --.

Signed and Sealed this

Second Day of March, 2004

JON W. DUDAS
*Acting Director of the United States Patent and Trademark Office*